United States Patent [19]

Allen

[11] 4,238,693
[45] Dec. 9, 1980

[54] LATCH CIRCUIT FOR DIGITAL CHARGE COUPLED SYSTEMS

[75] Inventor: Reginald A. Allen, Topanga, Calif.

[73] Assignee: TRW Inc., Redondo Beach, Calif.

[21] Appl. No.: 938,952

[22] Filed: Sep. 1, 1978

[51] Int. Cl.³ .................. G11C 19/28; H01L 29/78; H03K 19/20
[52] U.S. Cl. .................. 307/221 D; 307/216; 357/24
[58] Field of Search ............. 357/24; 307/216, 221 D

[56] References Cited

U.S. PATENT DOCUMENTS

| | | | |
|---|---|---|---|
| 3,777,186 | 12/1973 | Chang | 357/24 |
| 4,119,961 | 10/1978 | Rockett | 307/221 D |
| 4,135,104 | 1/1979 | Allen | 307/221 D |
| 4,155,076 | 5/1979 | Rockett | 307/216 |

OTHER PUBLICATIONS

Sequin et al. *Charge Transfer Devices* Academic Press, N.Y., (1975), pp. 270-274.

*Primary Examiner*—Gene M. Munson
*Attorney, Agent, or Firm*—Fraser and Bogucki

[57] ABSTRACT

A circuit for use in digital charge coupled systems provides successive indications of input binary value, until reset, without timing delays and without degeneration of the charge packets. A data input charge packet is provided to a storage electrode, and a series of standardized charge packets are also provided to the storage electrode at the data rate of the system. The latch circuit operates cyclically in internal cycles between the arrival of successive standardized charge packets. The concurrent presence of an input charge packet and a standardized charge packet results in charge overflow across a barrier in a first output data channel. This overflow causes a floating gate electrode that interconnects the first output channel with a second output channel to block transfer of the basic charge packet out the second output channel. It also causes the basic charge packet to be returned as a data input back to the storage electrode. With the basic charge packet representing a binary "1", therefore, the recirculation is effected with each arrival of a new standardized data packet. In the interim, however, the binary "1" valued charge packet is provided as an output at each clock interval from the first output channel. If the input represents binary "0", the floating gate does not inhibit transfer and a charge packet is not provided at the first output channel inasmuch as there is no overflow. Instead, an output charge packet is transferred out the second output channel to provide the complement of the data signal.

12 Claims, 5 Drawing Figures

LATCH CIRCUIT FOR DIGITAL CHARGE COUPLED SYSTEMS

BACKGROUND OF THE INVENTION

There has in the recent past been extensive work in the art of digital and analog charge coupled devices and systems. In this technology, charge packets are transferred along a semiconductor substrate from one electrode to another at high speed, with low power requirements, and within an extremely dense circuit configuration. In digital systems using charge coupled devices, the presence of a charge packet can represent one arbitrary binary value, generally chosen for convenience as binary "1" so that the absence of a charge packet then represents a binary "0".

Although the charge coupled device has relatively high efficiency, in preservation and retention of the integrity of a charge packet, leakage losses and transfer losses cannot be avoided, and the charge coupled devices must be used as dynamic elements. That is, charges are repetitively transferred along a chain of such devices, with logical gating functions and arithmetic functions being performed during the serial transfer. As the charge packets are transferred they are diminished in size due to the losses, and care must be taken to avoid dissipation of charge to a level at which an error is likely to occur in detection of the presence of the charge packet. To this end, many attempts have been made to design regenerator circuits, also sometimes referred to as refresh circuits, which respond to the presence of a diminished charge packet by generating a full charge packet. A particularly advantageous regenerator circuit, capable of use in providing a variety of concurrent logical functions, is described in a previously filed application of the present inventor entitled "Regenerator Circuit", Ser. No. 856,780, filed Dec. 2, 1977, now U.S. Pat. 4,135,104 issued Jan. 16, 1979, and assigned to the assignee of the present invention.

The dynamic transfer of charge packets along a series of electrodes is characteristic of a serial digital data handling system. Thus charge coupled devices employ dynamic storages, such as recirculating shift registers, to retain words and values for further processing. This imposes a penalty on the systems designer, and on the data rate achievable with the system, because it is often not desirable to accept the delay inherent in waiting for a word retained in a recirculating shift register to be returned to the index position. It is common in other circuit technology to utilize latch circuits, which are set to a given value and which retain that binary value until such time as reset, and this expedient has many potential applications in digital charge coupled systems. The ability to store, and make available at every clock time, a single bit of information, can be very useful. Preferably, however, both the digital value and its complement are provided, and there is no degeneration of the output charge packet despite the length of the interval involved.

SUMMARY OF THE INVENTION

In accordance with the invention, an integrated charge coupled device responds to an input data signal, once applied, by generating both the data signal and its complement at successive clock times thereafter, until reset. Within clock intervals denoted by successive standardized charge packets, a charge packet is transferred out either one of two output channels which correspond to the data value and its complement, respectively. An initial data valued charge packet applied to a storage electrode causes overflow from the storage electrode across a barrier in a first output channel, with ultimate output transfer of the overflow charge packet from that channel representing a selected binary value (e.g. binary "1"). Concurrently, the basic or remaining charge packet is recirculated back to the storage electrode input as a replacement for the original data input, so that the operation may be repeated at the next clock time. A second output channel coupled to the storage electrode and to the recirculating loop is blocked from data transfer if the overflow is present in the first channel. However, in the absence of overflow the basic charge packet is directed out the second output channel, to indicate the complement value.

In accordance with other features of the invention, the first and second output channels are interconnected by a floating gate, a master gate end of which receives the overflow pulses from a barrier gate in the first output channel, and the slave gate end of which either permits transfer of the basic data charge packet out the second output channel, or causes it to be diverted into the recirculating loop. The slave gate end is preset to a selected initial level, and the latch device may be reset by circuit means coupled to the recirculating loop, to transfer out a recirculating charge packet.

BRIEF DESCRIPTION OF THE DRAWINGS

A better understanding of the invention may be had by reference to the following description, taken in conjunction with the accompanying drawings, in which.

DETAILED DESCRIPTION OF THE INVENTION

Figure 1:
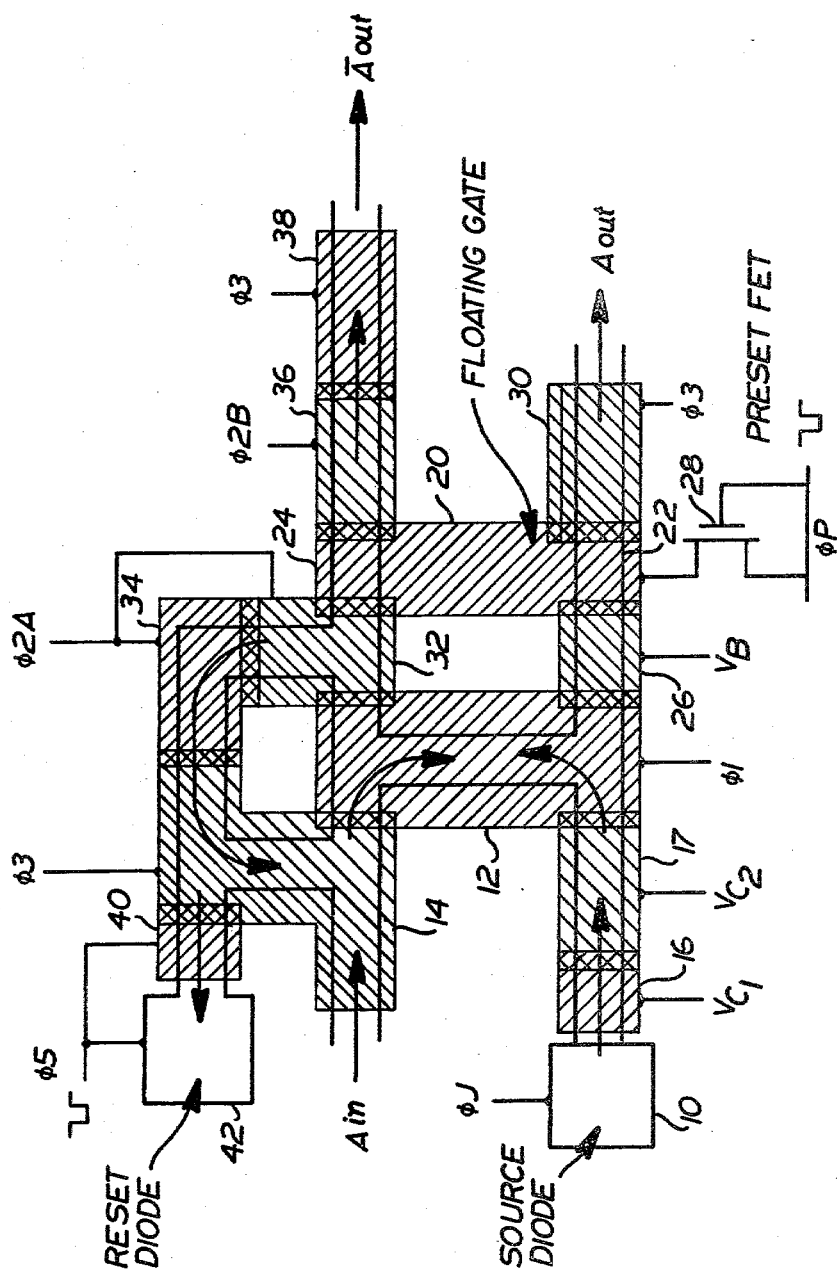
FIG. 1 is a schematic plan view of a charge coupled device latch circuit in accordance with the invention.
Figure 3:
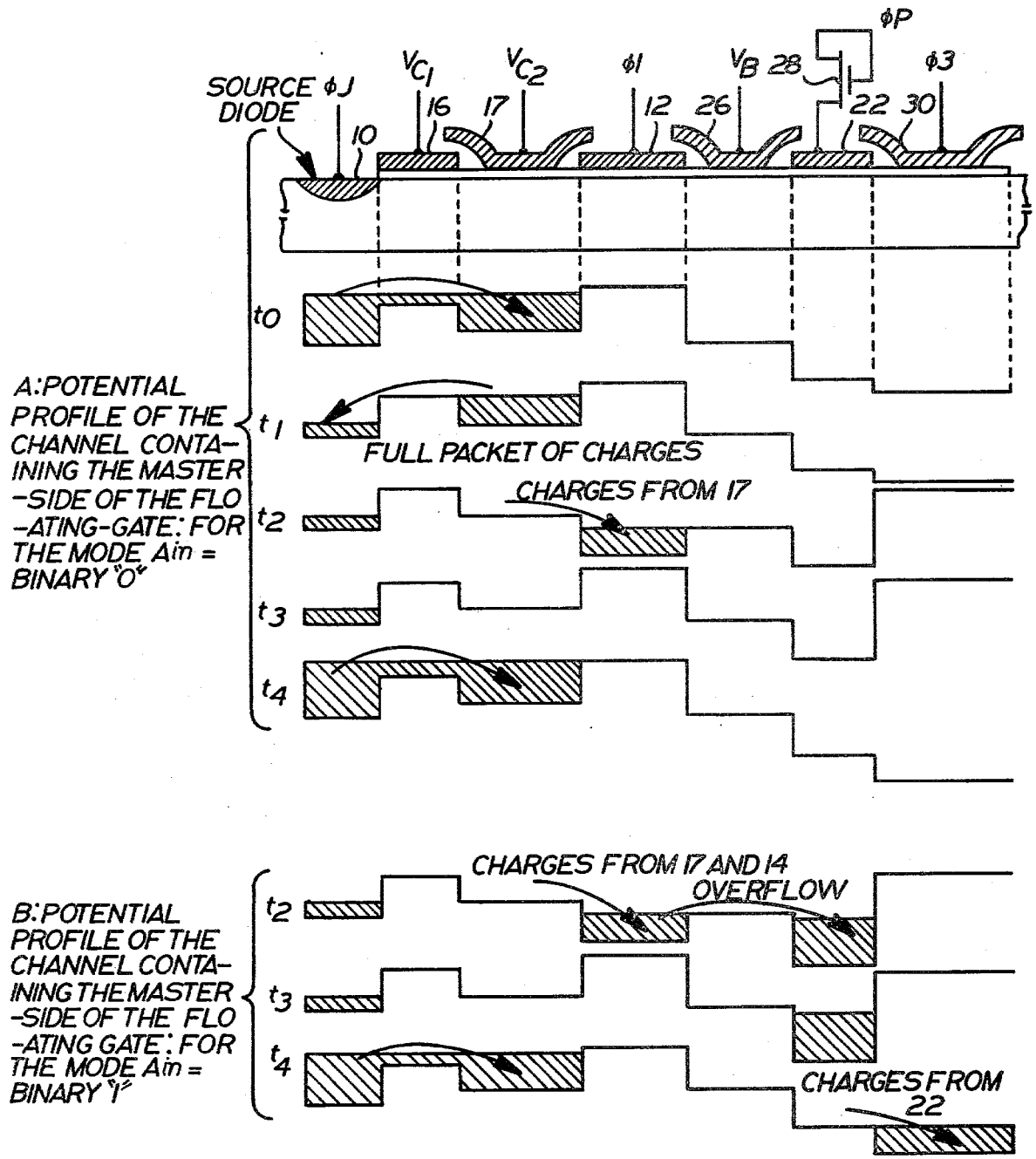
FIG. 3 is an idealized side sectional view of one channel of charge coupled elements in the device of FIG. 1, showing potential profiles and charge packet transfers at different times when the data input is binary "1" and binary "0" respectively.
Figure 4:
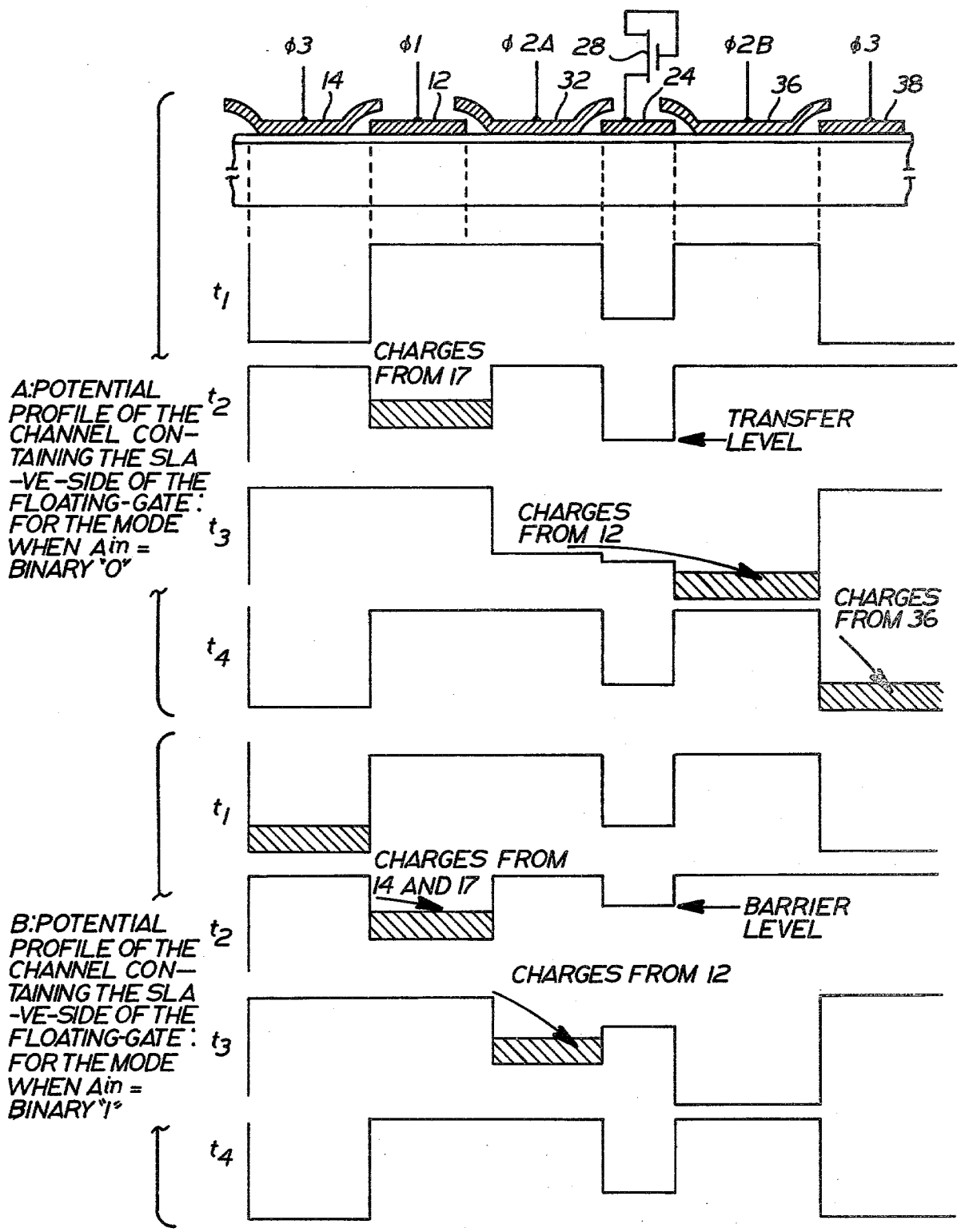
FIG. 4 is an idealized side sectional view of a different output channel used in the arrangement of FIG. 1, showing potential profiles and charge packet transfers at different times when data input is binary "0" and binary "1", respectively.
Figure 5:
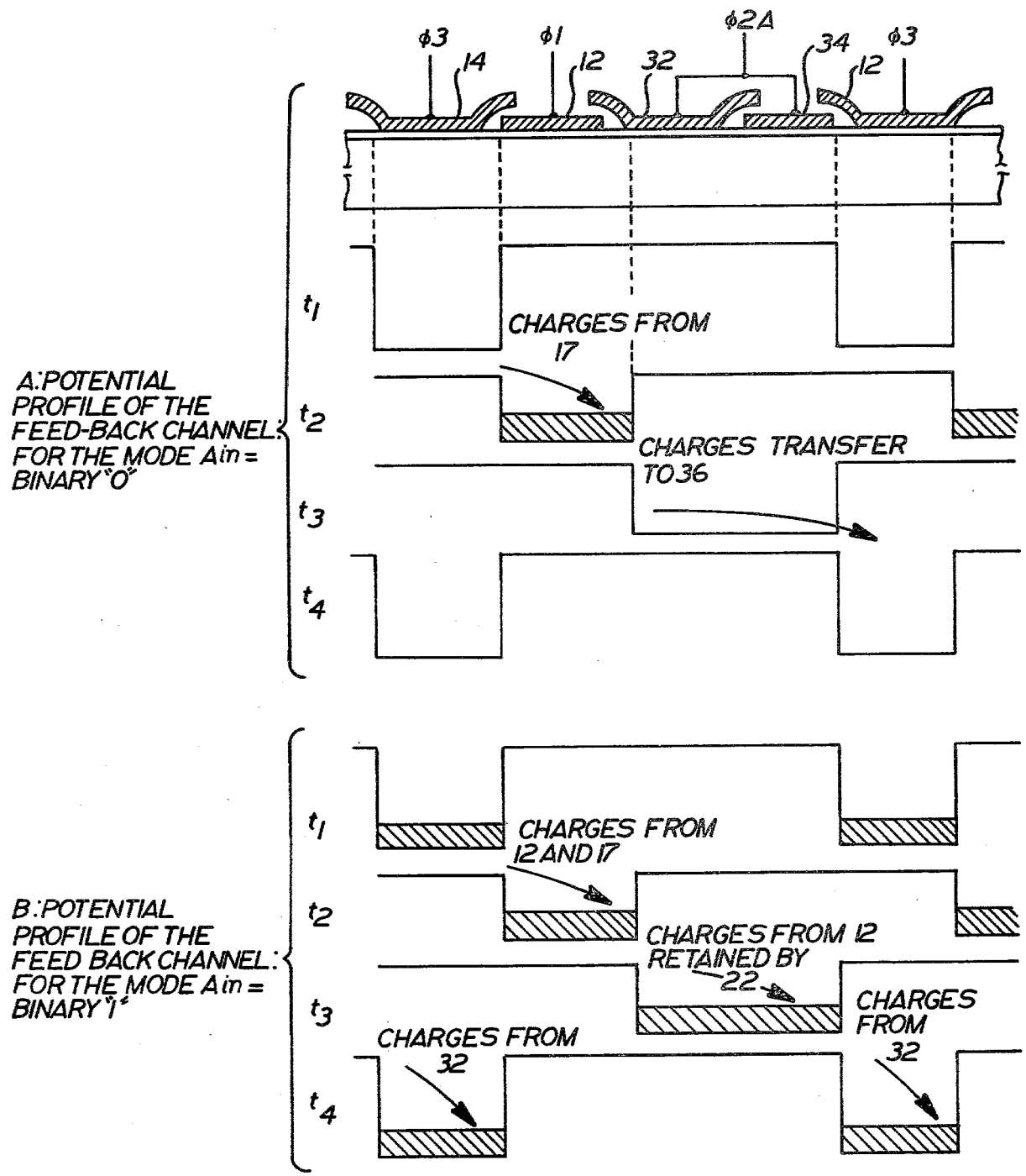
FIG. 5 is an idealized side sectional view of a feedback channel used in the arrangement of FIG. 1, together with potential level differences occurring at different times when the data input is binary "0" and binary "1", respectively.

A latch circuit for charge coupled devices is depicted in somewhat idealized form in FIG. 1, and also represented in somewhat simplified form for clarity in the side sectional representations of portions of the circuit in FIGS. 3, 4, and 5. However, those skilled in the art will recognize that the manner in which the electrodes are arranged relative to a substrate and in which electrode elements overlie and interrelate with each other are well understood, and therefore specific details have been omitted for clarity. Similarly, the manner in which the needed phase signals and bias levels are generated and applied to the elements of the system are well understood, and details of this portion of the system have also been omitted for simplicity.

In the latch circuit of FIG. 1, it is desired to set the data represented in accordance with a given input value $A_{IN}$ (either binary "0" or binary "1"), and to provide that data value $A_{OUT}$ and its complement $\overline{A}_{OUT}$ at each clock time thereafter. The clock times are coincident with the phase signals $\phi J$ as shown by the corresponding timing waveform in FIG. 2. At each clock time during the $\phi J$ phase, standardized charge packets are provided from a source diode 10. Between the clock times, the latch circuit must make output data available, and recycle itself automatically (until reset) to provide a corresponding data signal at the next clock time. To this end, a storage electrode 12 is coupled to receive the $A_{IN}$ charge packet from an OR gate 14 at one input side, and from a pair of statically biased gates 16, 17, at another input side. The first gate 16 may be referred to as an input gate and the second gate 17 as a storage gate. The "OR" gate electrode 14 forms part of a positive feedback channel, but does not permit transfer of the $A_{IN}$ charge packet other than to the storage electrode 12, because of the bias level on associated elements in the recirculating loop. The standardized charge packet from the source diode 10 is transferred into the storage electrode 12 at $\phi 1$, when the potential on the electrode 12 is lowered to a potential level below the second gate electrode 17.

The present circuit is described as employed in conjunction with a P-surface-channel substrate, and those skilled in the art will recognize that operation of an N-surface-channel circuit is no different except for the inversion of the polarity of the clock waveforms.

The storage electrode 12 receives either one or two input charge packets, depending on whether $A_{IN}$ is a binary "1" when the applied potential is lowered at phase $\phi 1$. Two output channels are coupled to the storage electrode 12, for transfer of charge packets in different paths depending upon which binary value is to be represented. These output channels are interconnected by a floating gate 20 having a master end 22 in a first output channel and a slave end 24 in the second output channel. The master end 22 is interconnected to the storage electrode 12 by a barrier gate 26, to which is applied a biasing voltage $V_B$ such that all charge in excess of a basic or remaining charge packet flows across the barrier to act as a bias on the floating gate 20. The floating gate 20 is first preset at $\phi P$ by the application of a negative pulse to a precharge FET 28, to insure that a selected initial voltage level is maintained. A charge packet flowing across the barrier gate 26 may thereafter be supplied as $A_{OUT}$, at $\phi 3$, via an output gate 30 coupled to the master end 22 of the floating gate 20.

In the other output channel, a branch gate 32 provides an alternative coupling between the storage electrode 12 and the slave end 24 of the floating gate 20, or a positive feedback channel which returns through a feedback transfer gate 34 to the OR gate 14. In the second output channel, charge packets transferred through the branch gate 32 are directed across the slave end 24 (when permitted) to an output storage electrode 36, and thereafter to a complement output gate 38, where the value $\overline{A}_{OUT}$ is represented by the presence of the charge packet.

In the feedback channel, a shunt path is provided from the OR gate 14 via a coupled sink gate 40 connecting to a reset diode 42 which receives a momentary negative pulse at $\phi 5$, to act as a sink to charges under the OR gate 14. The timing relationships of the various phase signals, and the charge variatons on the various gates, are depicted in other figures and described in detail hereafter.

The operation of the latch circuit of FIG. 1 may, however, be better understood in general relation to the flow of charge packets through the input channels, the output channels and about the positive feedback channel. As is well understood by those skilled in the art, the presence of a charge packet at the master end 22 of the floating gate 20 changes the slave end 24 from a transfer gate to a barrier gate. Consequently, when a binary "1" is used to set the latch, the concurrent standardized packet from the source diode and the $A_{IN}$ charge packet are received at $\phi 1$ under the storage electrode 12. The standardized charge packet is assumed to be essentially 100% of some nominal value, whereas the data input $A_{IN}$ may have been subjected to several transfers and may be of a lesser amplitude, e.g. 80% of the standardized charge packet value. It is important that this diminished input charge not be further diminished, no matter how long the latch circuit must maintain the same value before being reset.

The overflow of the excess (80%) charge packet across the barrier gate 26 thereafer shifts the slave end 24 of the floating gate 20 to a barrier state. Subsequently, the basic charge packet under the storage electrode 12 is diverted from the branch gate 32 into the positive feedback channel, and returned via the feedback transfer gate 34 and the OR gate 14 to the input side of the storage electrode 12. Concurrently with this feedback, the output gate 30 is caused to transfer the binary "1" valued $A_{OUT}$ packet to associated circuits.

To retain the latch circuit in the binary "1" state, the recirculated basic charge, stripped of the overflow and therefore at 100% of value, is augmented by a new standardized charge packet from the source diode 10 at the next clock time and the sequence is repeated. Each $A_{OUT}$ charge packet thereafter is of full amplitude. When the latch circuit is to be refreshed, the recirculating charge packet in the feedback channel is diverted to the reset diode 42 via the sink gate 40 by the momentary negative pulse applied at $\phi 5$.

Thereafter, the system remains in the binary "0" state until the binary "1" state is to be reestablished. Under these circumstances, only the basic charge packet is entered under the storage electrode 12, so that the slave end 24 of the floating gate 20 functions as a transfer gate. In this mode the charge packet is shifted successively across the branch gate 32 and the slave end 24 and transfers to an output storage electrode 36, where it may thereafter at $\phi 3$ be transferred via the complement output gate 38 as $\overline{A}_{OUT}$. Following each clock time thereafter, the sequence is the same until the binary state is changed, with the standardized charge packet being transferred out the second output channel. Thus it may be appreciated that both the true and complement values are serially supplied until the binary state is changed, and that there is automatic regeneration of the charge packets in all modes of operation.

Figure 2:
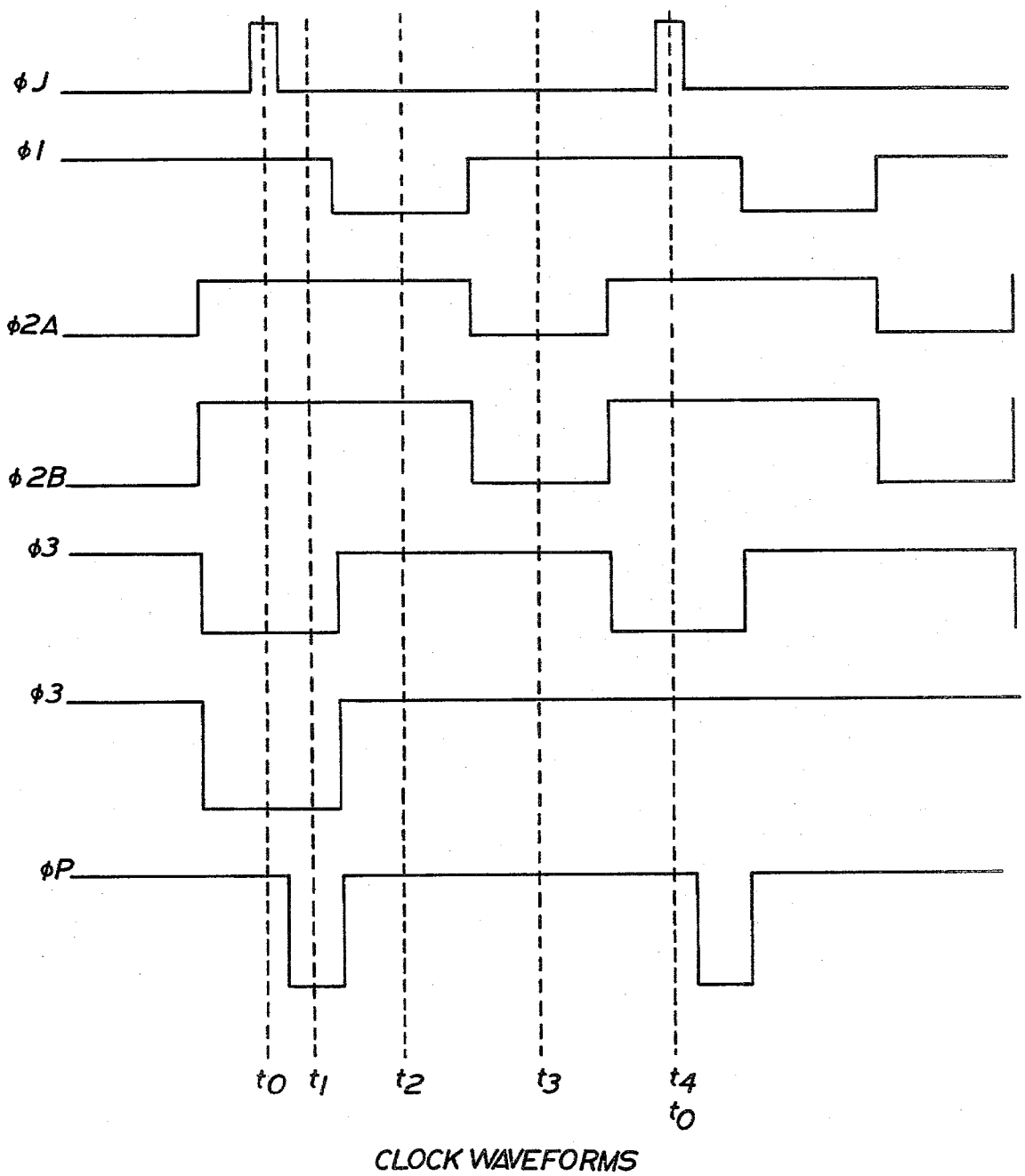
FIG. 2 is a graphical representation of timing waveforms which are designated as phase signals in the device of FIG. 1.

Specific examples of timing waveforms are provided in FIG. 2, the various phase signal variations which change the bias levels on the gates being depicted relative to a repetitive timing sequence $t_0$–$t_4$. The movement of the charge packets along the successive gates are depicted in the simplified side sectional views of chains of gates in FIGS. 3, 4, and 5. Each Figure represents charge packet movements for both of the different binary states of the latch circuit.

In FIG. 3 the input channel from the source diode 10 through the storage electrode 12 and the master-side of the floating gate 20 to the first output channel is depicted in generalized form, the bias levels varying as shown by the waveforms corresponding to $t_0$–$t_4$, relative to the charge packets designated by shading. The standardized input charge packet from the source diode 10 is made more uniform by a serial arrangement of the gates 16, 17, which are differentially biased so that the bias difference determines the charge packet held under the storage electrode 17, as the excess is returned to the sink, in the fashion described in previously referenced application Ser. No. 856,780, filed Dec. 2, 1977 for "Regenerator Circuit."

the various bias levels $V_{CI}$, $V_2$ and $V_B$ on the gates 16, 17 and 26, respectively, are not changed, but the potential at the storage electrode 12 and the output gate 30 varies at successive time intervals. For the binary "0" state (the potential profiles represented at A), a full charge packet held under the storage gate 17 at time $t_1$ is transferred into the area under the storage electrode 12 as the potential level is lowered. This packet is held thereunder by the barrier represented by the barrier gate 26, but the charge packet under the storage electrode 12 disappears from this channel inasmuch as it is directed out the second output channel.

When the binary "1" condition is indicated (the potential profiles represented at B) the input packet $A_{IN}$ is directed under the storage electrode at $t_2$, but the overflow goes across the barrier represented by the potential level of the barrier gate 26 under the master end 22 of the floating gate 20, as seen at the waveform $t_2$ in FIG. 3B. When the $\phi_3$ signal lowers the potential at the output gate 30 at $t_4$ the charge packet is provided as the output signal.

The channel path from the OR gate 14 through to the second output channel as depicted in the side sectional view of FIG. 4, which includes at A the associated potential profile waveforms at $t_1$–$t_4$ respectively for the binary "0" status. Only a single charge packet is entered under the storage electrode 12 at $t_2$, while the intermediate slave side 24 of the floating gate 20 is normally maintained at a low voltage potential, i.e. in the transfer mode. When the branch gate 32 and output storage electrode 36 are shifted to a lower potential level at $\phi_2$ and $\phi_{2B}$ respectively, successive transfer of charge takes place from the storage electrode 12 to the output storage electrode 36 at $t_3$. Final output transfer to the complement output gate 38 takes place at $t_4$.

The difference in operation of the second output channel when a binary "1" state is indicated may be seen by reference to the potential profiles B of FIG. 4, as well as the waveforms of FIG. 5, which represent the potential profiles for the feedback channel. In the binary "1" state, as shown at B in FIG. 4, the charges from the storage electrode 12 are transferred under the branch gate 32 at $\phi_{2A}$. The charge packet cannot be transferred past the slave end 24 of the floating gate 20, however, because its potential level is raised to present a barrier due to the floating gate action, so that the charge packet under the branch gate 32 is directed out into the feedback channel at $t_3$. It is then returned to the OR gate 14 at $t_4$ as shown at B in FIG. 5. When the binary "0" state is maintained, however, the charges under the storage electrode 12 are directed out the first output channel, as previously described relative to FIG. 3.

Although there have been described above and illustrated in the drawings various modifications and alternative arrangements for latch circuits in accordance with the invention, it will be appreciated that the invention is not limited thereto but encompasses all forms and variations within the scope of the appended claims.

What is claimed is:

1. A latch circuit for digital charge coupled devices (CCD) in a system providing input signal and clock signal charge packets comprising:

storage electrode means for storing charge packets provided thereto, the storage electrode means including a pair of input channels and a pair of output channels, a first of said input channels receiving an input signal charge packet and the second of said input channels receiving a clock signal charge packet, said storage electrode means including means providing overflow charge packets to a first output channel upon reception of an input signal packet with a clock signal charge packet;

means intercoupling the output channels for blocking transfer of charge packets along the second output channel in response to the transfer of an overflow charge packet along the first output channel;

and means coupled to the second output channel for recirculating charge packets from the storage electrode to the second input channel.

2. The invention as set forth in claim 1 above, wherein the input signal charge packets and clock signal charge packets have a like nominal charge value, and including in addition phase control means coupled to the input channels, to the output channels, to the means for blocking transfer, and to the means for recirculating, for cycling charge packet transfers between clock signal charge packets, such that like output charge packet combinations are transferred at the output channels at the time of each clock signal charge packet until a different input signal charge packet is provided.

3. The invention as set forth in claim 2 above, including in addition barrier means coupled in the first output channel for controlling overflow of charge packets in excess of the nominal charge value from the storage electrode means, and wherein said means for blocking transfer comprises a floating gate electrode.

4. The invention as set forth in claim 3 above, wherein said floating gate electrode has a master end thereof responsive to overflow charge packets in the first output channel for providing the floating gate electrode with a predetermined bias and a slave end thereof for blocking transfer of charge packets along the second output channel whenever the floating gate electrode is provided with the predetermined bias, wherein said second output channel includes branch gate means between the storage electrode and the slave gate for directing charge packets from the second output channel to the means for recirculating whenever the slave end blocks transfer of charge packets along the second output channel and wherein the means for recirculating is coupled between the branch gate means and the first input channel, and including in addition a sink for removing charge packets in the means for recirculating.

5. The invention as set forth in claim 4 above, wherein the presence of an input charge packet represents a binary "one" and the absence thereof represents a binary "zero", wherein the presence of a charge packet in the first output channel indicates the binary "one" value and the presence of a charge packet in the second output channel represents its complement, and wherein the phase control means and the means for recirculating provide successive recirculation of charge packets in synchronism with successive clock signal charge packets, such that there is automatic regeneration of the charge packets when the binary "one" value is held in the latch circuit.

6. A latching circuit for digital charge coupled devices comprising:

storage electrode means for storing charge packets provided thereto;

first input means coupled to said storage electrode means for providing data input charge packets to said storage electrode means;

second input means coupled to said storage electrode means for providing standardized charge packets to said storage electrode means;

first output channel means coupled to said storage electrode means for transferring charge packets from the storage electrode means;

second output channel means coupled to said storage electrode means for transferring charge packets from the storage electrode means;

means disposed in said first output channel means for transferring out as overflow all charge in excess of a predetermined standardized amount;

means intercoupling said first and second output channel means for blocking charge packet transfer along said second output channel means in the event of a charge packet in excess of the predetermined level being transferred along said first output channel means, and transferring out charge packets in said second output channel means in the event that an overflow is not present in said first output channel means; and means coupled to said second output channel means and coupled to provide an input to said storage electrode means for recirculating charge packets to said storage electrode means in the event an overflow prevents transfer out of said second output channel means, such that standardized charge packets are returned to said storage electrode means.

7. The invention as set forth in claim 6 above, including means coupled to said latching circuit for progressively transferring the charge packets into and out of said storage electrode means, including means for providing a sequence of standardized charge packets to said storage electrode means, and cycling means for controlling transfer of output charge packets during the interval between the arrival of standardized charge packets.

8. The invention as set forth in claim 7 above, wherein said means for controlling transfer of charge packets along said second output channel means comprises a floating gate electrode having a master gate end thereof disposed along said first output channel and an opposite slave gate end thereof disposed along said second output channel means.

9. The invention as set forth in claim 8 above, wherein said first output channel means is coupled to provide a normal data output signal, and wherein said second output channel means is coupled to provide the complement of the normal output data signal.

10. The invention as set forth in claim 9 above, wherein said first output channel means includes a barrier electrode coupling the storage electrode means to the master gate end of the floating gate electrode, and including biasing means for providing overflow of that portion of a charge packet in excess of a standardized charge packet, and further including means coupled to the master gate end of said floating gate electrode for presetting the potential of said master gate end.

11. The invention as set forth in claim 10 above, wherein said means for recirculating charge packets comprises a series of transfer electrodes coupling the second output channel to the input receiving the data input charge packets, and further including in addition means coupled to said series of transfer electrodes for resetting the data state by transferring out charge packets during recirculation.

12. A digital charge coupled device (CCD) latch circuit comprising:

storage electrode means for storing charge packets provided thereto, the storage electrode means including a first input for receiving an input charge packet designating one binary state and a second input receiving successive clock charge packets of like given amplitude;

a first output channel;

overflow barrier means coupled in the first output channel to said storage electrode means for providing as output that overflow charge at said storage electrode means that is in excess of the given amplitude;

a second output channel;

branch gate means coupled in the second output channel to said storage electrode means for transferring out a residual charge packet at said storage electrode means;

output transfer control means coupled in said second output channel for blocking transfer of charge along the second output channel in response to the existence of an overflow charge in the first output channel;

recirculating means for coupling said branch gate means to the first input of said storage electrode means; and phase control means coupled to the branch gate means, the output transfer control means and the recirculating means for directing a residual charge packet from said storage electrode means along said second output channel in the absence of an overflow charge or returning the residual charge packet to the storage electrode means in synchronized relation to the next clock charge packet whereby the circuit indicates a given binary state or its complement and continually refreshes the charge packets.

* * * * *